(12) United States Patent
Fauveau

(10) Patent No.: US 7,932,714 B2
(45) Date of Patent: Apr. 26, 2011

(54) METHOD TO COMMUNICATE WITH MULTIVALVED SENSOR ON LOOP POWER

(75) Inventor: Eric Fauveau, Baton Rouge, LA (US)

(73) Assignee: K-TEK Corporation, Prairieville, LA (US)

( * ) Notice: Subject to any disclaimer, the term of this patent is extended or adjusted under 35 U.S.C. 154(b) by 73 days.

(21) Appl. No.: 12/116,275

(22) Filed: May 7, 2008

(65) Prior Publication Data

US 2009/0295367 A1    Dec. 3, 2009

Related U.S. Application Data

(60) Provisional application No. 60/916,707, filed on May 8, 2007.

(51) Int. Cl.
*G01R 1/20* (2006.01)
(52) U.S. Cl. ...................................... 324/126
(58) Field of Classification Search .................. None
See application file for complete search history.

(56) References Cited

U.S. PATENT DOCUMENTS

| | | | | |
|---|---|---|---|---|
| 5,607,002 A * | 3/1997 | Siegele et al. | ................. | 141/198 |
| 6,307,483 B1 * | 10/2001 | Westfield et al. | ........ | 340/870.11 |
| 6,473,710 B1 * | 10/2002 | Eryurek | ........................ | 702/133 |
| 6,985,831 B2 * | 1/2006 | Ito et al. | ........................ | 702/188 |
| 2007/0150146 A1 * | 6/2007 | Bernardi et al. | ................. | 701/50 |
| 2007/0270982 A1 * | 11/2007 | Foss et al. | ....................... | 700/26 |

\* cited by examiner

*Primary Examiner* — Roberto Velez
(74) *Attorney, Agent, or Firm* — Jones, Walker, Waechter, Poitevent, Carrere & Denegre, L.L.P.

(57) ABSTRACT

A method and apparatus for detecting at least two process variables in a loop powered circuit. The method includes the steps of (a) powering the loop, detecting a first process variable value during a first time interval, (b) detecting a second process variable value during a second time interval after the expiration of the first time interval, where the detected process variable values are represented by the magnitude of a current passing through the loop circuit.

14 Claims, 2 Drawing Sheets

US 7,932,714 B2

METHOD TO COMMUNICATE WITH MULTIVALVED SENSOR ON LOOP POWER

PRIORITY CLAIM

This application claims the priority benefit of U.S. provisional application No. 60/916,707 filed on May 8, 2007, and which application is hereby incorporated by reference.

FIELD OF INVENTION

This Invention relates to loop-powered two wire devices.

BACKGROUND OF INVENTION

Process variable transmitters are widely used for sensing or measuring a process variable, and transmitting data so generated to a remote location. A common means for transmitting such data is by means of a current loop, the value of the process variable being represented by the magnitude of a current passing through the loop, the magnitude lying between predetermined minimum and maximum values, typically 4 ma and 20 ma. Such a current loop has a high degree of noise immunity and widespread industrial acceptance.

The transmitter will usually have electrical power requirements of its own, and it is often convenient to meet these power requirements from the current passing in the loop. A limitation of such loop-powered transmitters has been that they must be able to operate at the minimum level of loop current, typically 4 ma.

A characteristic of prior art loop powered devices is that each device must have a separate loop powered circuit. First, as there is no effective method to separate the output from multiple powered devices on a single loop powered circuit. Second, the loop current has a maximum current of 20 ma, and placing multiple devices on the loop would quickly exceed the current limitation, leaving no room to communicate signals via current modulation.

One method to expand use of the legacy 2-40 mA systems is to implement a digital signal on top of the analog loop current. For instance, HART protocol is such an implementation, The HART protocol uses 1200 baud Frequency Shift Keying (FSK) based on the Bell 202 standard to superimpose digital information on the conventional four to 20 mA analogue signal. Both the 4-20 mA current and the digital signal are valid output values from the instrument. The polling address of the instrument is set to "0". Only one instrument can be put on each instrument cable signal pair, if the instrument is powered from the loop.

In a second HART version, multiple devices can be positioned on a single loop wire pair and the devices are powered through the loop current. In this embodiment, a multidrop environment, the loop current is used to power the devices and to support digital signal communications. FSK is used to address and poll each device, and FSK is used by the device to respond to a request by the controller. In multidrop mode it is possible to have up to 15 instruments on one signal cable. The polling addresses of the instruments will be in the range 1-15, and each meter sensor needs to have a unique address. Each device is polled through its address by a controller to establish communication with the addressed device. Once in communication with a controller, measurement and control of devices within the process is effected, with the device responding via FSK to the controller.

There is a need to be able to use a legacy loop powered circuit to communicate with at least two devices, or to communicate with a single device that can provide multiple readings without using separate power or HART protocol or other digital protocol communications.

SUMMARY OF THE INVENTION

A method and apparatus for detecting at least two process variables in a loop powered circuit. The method includes the steps of (a) powering the loop, detecting a first process variable value during a first time interval, (b) detecting a second process variable value during a second time interval after the expiration of the first time interval, where the detected process variable values are represented by the magnitude of a current passing through the loop circuit.

PREFERRED EMBODIMENT

The improved loop powered system uses a two wire loop, a loop powered sensor (commonly called a loop powered transmitter), a power source (typically a battery) to power the control system, and upon activation by the control system including a controller 30 (commonly called a receiver) to provide power to the sensors at preselected intervals. The controller also receives the information from the sensor 20. The controller 30 can include a processor having an internal clock, a PLC with external clock, or some other means to selectively power the loop powered sensors at predetermined times or predetermined intervals, and to read the response of the sensor. Generally, the controller is always powered (but may be in sleep mode, as later discussed). The sensor measures the value of a process variable ("process variable" can be a process condition, such as temperature, pressure, ph, flow, process level, or the state of a process control equipment or instrument, such as the setting of a valve). The control system includes a timing circuit to periodically power the loop. The timing circuit can an internal clock tied to a PLC or processor in the controller, or a separate timer, such as a remotely located clock that signals the controller (including wireless signals through a cell modem or antenna) to power the loop circuit (powering the loop circuit means powering the sensor) by initiating a connection of the battery. The controller 30 includes a receiver that detects or reads the current variations on the loop circuit. The received value may be stored in the control system for later retrieval, transmitted to a remote location (such as through a wireless modem), or displayed, such as on a chart recorder. In wireless applications, the control system often goes into sleep mode (for instance, under the control of an internal clock or timer, or under the control of an external timing circuit) to save on power consumption and periodically "wakes up" based upon clock values or external prompt to make a measurement of the process variables on a demand basis. In sleep mode functionality of the controller is reduced to minimize the current draw of the controller, for instance, no monitoring of the loop circuit is undertaken (but the controller does monitors for a "wake" signal) and no power is provided to the sensors. The improved loop powered system uses the power up sequence as means of synchronization, so one single 4-20 mA output can be used to retrieve multiple several process variables or conditions.

Figure 1A:
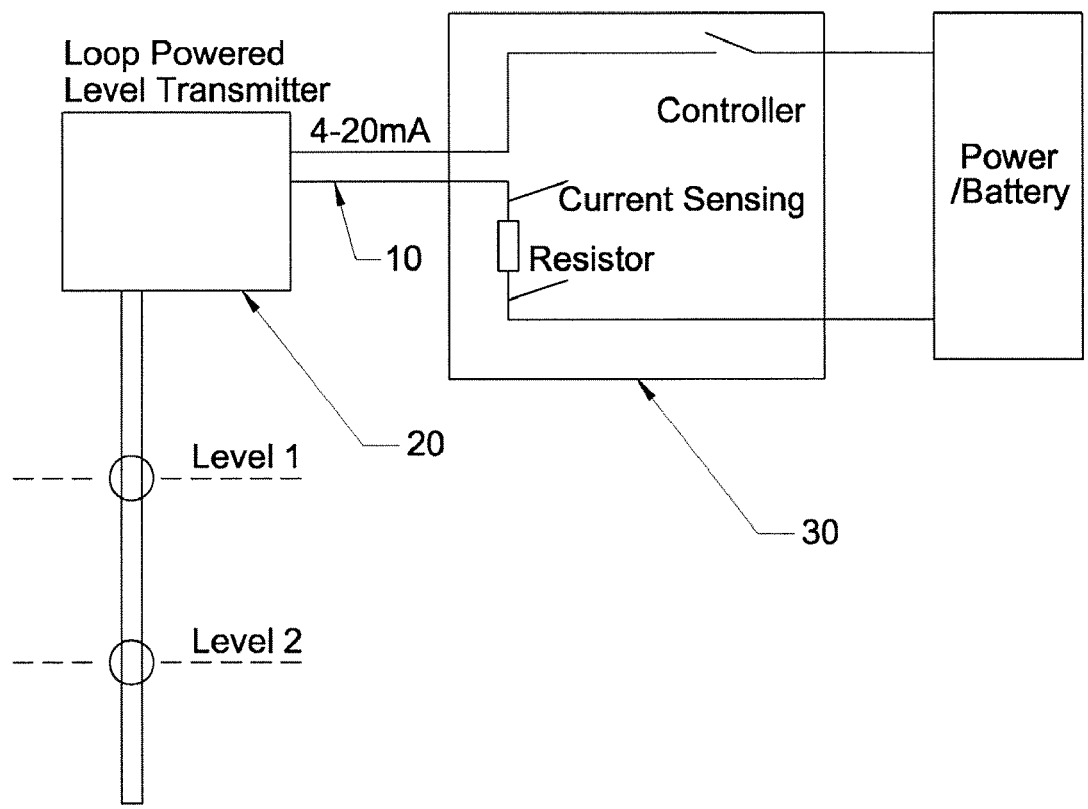
FIG. 1A depicts a loop circuit using a dual reading sensor.
Figure 1B:
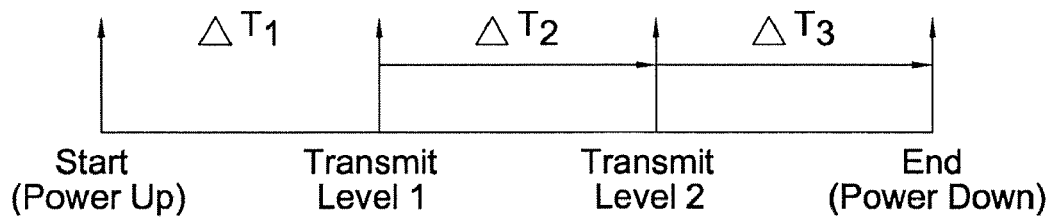
FIG. 1B depicts a timing diagram for circuit using a dual reading sensor

In one embodiment shown in FIG. 1A, positioned on the loop 10 is sensor 20 (embodied in a loop powered transmitter) that can measure at least two process variables, such as temperature/pressure, or in a level meter, a first interface level and a second interface level (such as total level). Shown is a dual level meter available from K-Tek Corp as the MT2000I guide wave level meter or AT100 magnetostrictive dual level meter. The sensor 20 should be semi-intelligent, in the sensor 20 should be programmable or configurable (such as with a clock or timer circuit) so that upon start up (power-up) the sensor 20 (after a suitable time to achieve stability) will sense the process variables and transmit the sensed conditions serially (see FIG. 1B (transmit)). The sensor 20 may detect the first process condition and transmit this first sensed process condition (often, the detect and transmit will occur multiple times) and after a set period of time, the sensor will detect the second process condition and transmit the sensed condition over the loop. Alternatively, the sensor 20 may detect both process conditions almost simultaneously, and only transmit one of the sensed conditions. The other sensed condition may either be stored for later transmittal, or ignored. For instance, in the case of a level meter that can sense at least two liquid interfaces in a process tank, after the system controller provides power to the loop circuit, the level meter will power up and stabilize, and sense both levels almost simultaneously. This embodiment of a dual level meter sensor then transmits one of the detected interfaces via current modification of the current loop, and after a preselected period of time, the sensor would transmit the other of the detected interfaces via current modification of the current loop. The controller would then power down the current loop.

In this fashion, the improved loop powered system uses the powering of the current loop to initiate a sequence where a sensor 20, sensing multiple process conditions, can power up, sense the individual process conditions, and transmit each sensed process condition serially, one per preselected time period. The receiver receiving the sensed conditions from the loop circuit must be aware of the sequence timing intervals and the process conditions transmitted in interval 1, interval 2, etc., or if transmitted to a remote location, the remote location receiver system must be aware of the sequence timing and process conditions in each timing interval.

Figure 2A:
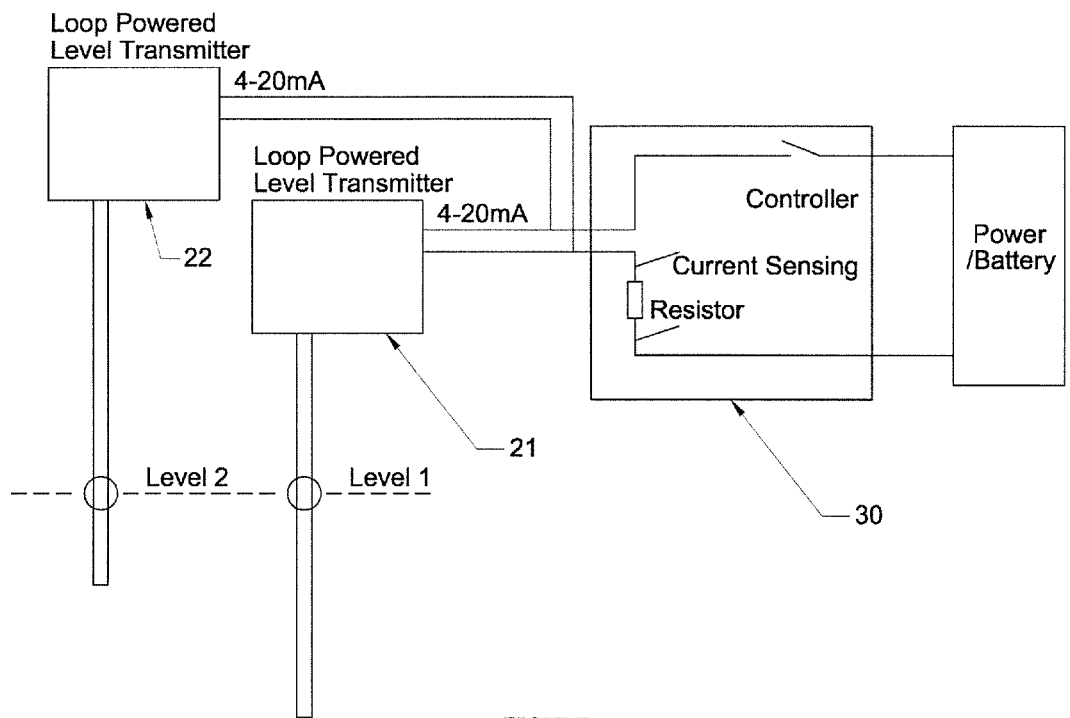
FIG. 2A depicts a loop circuit using two single valued sensors.
Figure 2B:
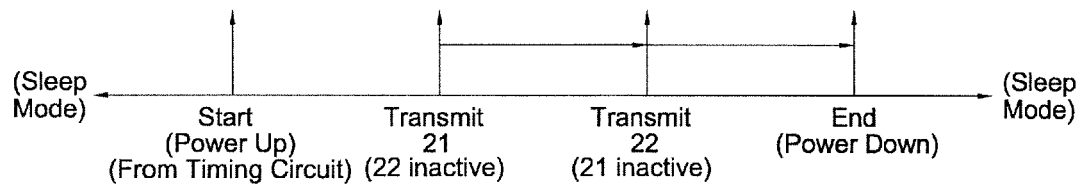
FIG. 2B depicts a timing diagram for a circuit using two sensors.

Alternatively, at least two loop powered sensors (transmitters) can be positioned on the same loop circuit (see FIG. 2A showing two sensors (21 and 22) in parallel on the loop). Upon circuit powerup, one of the sensors (say 21) is placed in active mode, sensing process conditions and transmitting sensed process conditions. The remaining sensors (here 22) are in quiescent or non-active mode to reduce power consumption. After a select period of time, the active sensor becomes inactive, and an inactive sensor is activated, thereby enabling the second sensor to activate sensing/transmission functions to communicate process conditions to a receiver. During power up, each sensor will draw current even in inactive mode, so there is a limit to how many sensors can be placed on the loop circuit set by the current draw of the active and non-active devices. The current draw must not exceed the 20 mA capacity, and indeed, should be well below the 20 mA capacity to leave enough range in the current for the active sensor to transmit its sensed process conditions via current modulation. For instance, if two sensors are on the loop with each drawing 3 ma in inactive mode, then the active sensor must be able to transmit its sensed value range over the available current range (here, 6-20 ma range available for use by the active sensor to indicate the sensed value). Again, each sensor must have an internal timer (such as a clock) to tell the sensor when to become active and inactive. The control 30 must be aware of the timing, or if the sensed values are transmitted remotely, the "intelligence" needed to understand the received values (e.g. which condition is being sensed) may be located at the remote location, with the control simply sending remotely the sensed values. The preset times or preselected intervals can be user configurable in the sensor and at the control system or remote system.

Finally, in a third embodiment, multiple sensors may be placed on the loop circuit, and each sensor includes a counter. Upon power up, every sensor is inactive, but the counters are incremented. Based upon the count value, one particular sensor will be active. On the next power up, the counters are again incremented, and a different sensor becomes active. For instance, in a two sensor environment, the first sensor will be active if the count is even and inactive when the count is odd, while the second sensor is the reverse.

I claim:

1. A method of detecting at least a first process variable and a second process variable in a loop powered circuit containing a sensor, the method comprising the steps of (a) powering the sensor through said loop powered circuit, detecting a first process variable value of said first process variable on said loop powered circuit during a first time interval after powering said sensor, (b) detecting a second process variable value of said second process variable on said loop powered circuit during a second time interval after the expiration of said first time interval, where said process variable values are represented by the magnitude of a current passing through said loop powered circuit without employing a digital protocol (c) removing power from said sensor; wherein said first process variable and said second process variable are different.

2. The method of claim 1 wherein said sensor comprises a first sensor measuring said first process variable value and a second sensor measuring said second process variable.

3. The method of claim 2 wherein said first sensor is a dual level meter.

4. The method of claim 2 wherein said first sensor measures temperature and pressure.

5. The method of claim 1 wherein said sensor comprises a first sensor measuring said first and second process variable.

6. The method of claim 5 wherein said first sensor is a dual level meter, wherein said first process variable represents is a first level, and said second process variable represents a second, different level.

7. The method of claim 5 wherein said first process variable represents temperature and said second process variable represents pressure.

8. The method of claim 1 further comprising transmitting said detected process variables to a remote location.

9. A loop powered circuit comprising a power source, a first sensor and a controller, said controller configured to periodically supply power from said power source to said first sensor thereby creating a current in said loop powered circuit, said first sensor configured to measure a first process variable and second process variable and further configured to modify the current in said loop power circuit without employing a digital protocol in response to a first process variable value of said first process variable in a first predetermined interval after power is supplied to said first sensor and to modify the current in said loop powered circuit without employing a digital protocol in response to a second process variable value of said second process variable in a second interval after said first predetermined interval; wherein said first process variable and said second process variable are different.

10. The loop powered circuit of claim 9 wherein said controller is configured with a sleep mode.

11. The loop powered circuit of claim 9 wherein said control system is further configured to receive wireless signals to initiate providing power from said power source to said first sensor.

12. A loop powered circuit comprising a power source, a first sensor and a second sensor and a control system, said control system comprising a controller configured to supply power from said power source to said first and second sensor thereby creating a current in said loop powered circuit, said first sensor configured to measure a first process variable value in a first predetermined interval in an active state of said first sensor, said second sensor configured to measure a second process variable in a time interval after said first predetermined time interval in an active state of said second sensor, said first and said second sensor configured to modify the current in said loop power circuit in response to said respectively measured process variable value without employing a digital protocol, said first sensor configured to be inactive when said second sensor is in said active state, said second sensor is configured to be inactive when said first sensor is in said active state.

13. The loop powered circuit of claim 12 wherein said control system further configured to receive wireless signals to initiate providing power from said power source to said first sensor.

14. The loop powered circuit of claim 13 wherein said timing circuit includes a clock.

* * * * *

UNITED STATES PATENT AND TRADEMARK OFFICE
CERTIFICATE OF CORRECTION

| | |
|---|---|
| PATENT NO. | : 7,932,714 B2 |
| APPLICATION NO. | : 12/116275 |
| DATED | : April 26, 2011 |
| INVENTOR(S) | : Eric Fauveau |

It is certified that error appears in the above-identified patent and that said Letters Patent is hereby corrected as shown below:

Title Page item (54) and Col. 1 (Title) should read: METHOD TO COMMUNICATE WITH MULTIVALUED SENSOR ON LOOP POWER Signed and Sealed this
Twenty-seventh Day of September, 2011

David J. Kappos
*Director of the United States Patent and Trademark Office*